March 28, 1961 J. S. MAYO 2,977,576
TRANSISTOR TIMING CIRCUIT
Filed Dec. 13, 1956 4 Sheets-Sheet 1

INVENTOR
J. S. MAYO
BY Alan C. Rose
ATTORNEY

TRANSISTOR TIMING CIRCUIT

Filed Dec. 13, 1956

INVENTOR
J. S. MAYO
BY Alan C. Rose
ATTORNEY

March 28, 1961 J. S. MAYO 2,977,576

TRANSISTOR TIMING CIRCUIT

Filed Dec. 13, 1956 4 Sheets-Sheet 3

INVENTOR
J. S. MAYO
BY Alan C. Rose
ATTORNEY

March 28, 1961 J. S. MAYO 2,977,576

TRANSISTOR TIMING CIRCUIT

Filed Dec. 13, 1956 4 Sheets-Sheet 4

INVENTOR
J. S. MAYO
BY Alan C. Rose
ATTORNEY

United States Patent Office 2,977,576
Patented Mar. 28, 1961

2,977,576

TRANSISTOR TIMING CIRCUIT

John S. Mayo, Newark, N.J., assignor to Bell Telephone Laboratories, Incorporated, New York, N.Y., a corporation of New York Filed Dec. 13, 1956, Ser. No. 628,146

12 Claims. (Cl. 340—174)

This invention relates to timing circuits and more specifically to transistor control circuits employing delay circuits.

It has been proposed heretofore to establish timing control cycles by the use of tapped delay lines. In these prior art circuits, the control leads of bistable circuits are coupled to the delay line taps, and pulses circulating in the delay line selectively change the state of the bistable circuits. Although these timing circuits were well adapted to certain vacuum tube pulse technologies, they are unnecessarily complex and expensive for use with present day transistor circuitry.

Accordingly, a principal object of the present invention is to reduce the complexity and cost of timing circuits.

A simple form of timing circuit in accordance with the invention includes a transistor having a delay circuit interconnecting its collector and base. A pulse generated as collector current starts flowing, is transmitted through the delay circuit, and is applied to the base to turn the transistor off. After the pulse passes through the delay circuit, the transistor starts conducting again. When the transistor is not controlled by additional circuitry a symmetrical square wave output signal is produced.

Additional transistor amplifiers may be connected in series at points along the delay loop, and the state of other transistor circuits outside of the delay loop may be changed in accordance with the voltage state at various points around the delay loop.

An advantage of the present circuits resulting from their operation on a change of state basis is that an accurately timed pattern of output signals may be provided over a time period which is twice as long as the delay time of the delay circuit which is employed.

In accordance with a feature of the invention, a transistor has a signal circuit including a delay line connected between its collector and base electrodes.

It is another feature of the invention that the control leads of at least one additional two-state transistor circuit are connected to spaced points along a delay loop circuit interconnecting the collector and emitter of a transistor.

In accordance with a specific feature of the invention, the driving circuits for a memory array are timed by connections to a number of spaced points along a delay loop interconnecting the output and input circuits of a transistor amplifier. Memory arrays in which the reading out of stored information destroys the stored information normally require timing control cycles having "read" and "write" portions. When used to control memory arrays, the present timing circuits have the advantage of switching from the "read" to the "write" portion of the timing cycle immediately.

Other objects, features, and advantages of the invention may be readily apprehended by reference to the following detailed description and to the accompanying drawings, in which.

Figures 1, 2:
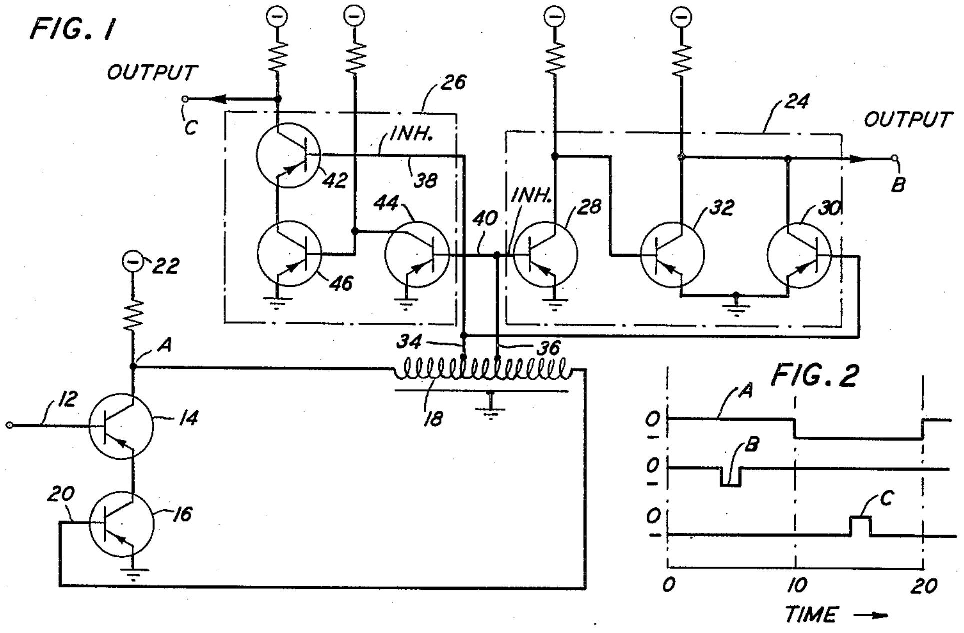
Fig. 1 is a circuit diagram of a transistor control circuit in accordance with one specific embodiment of the invention.
Fig. 2 is a plot of some of the wave forms present in the circuit of Fig. 1.

The circuit of Fig. 1 is a circuit of the type which is now generally termed "Direct Coupled Transistor Logic" circuitry. The transistors in "Direct Coupled Transistor Logic" circuits are characteristically arranged in circuit configurations with all or most of the transistor emitters connected to a common point such as ground, and the base of one transistor is often connected to the collector of the preceding transistor. The characteristics of the transistors employed in "Direct Coupled Transistor Logic" or D.C.T.L. circuits are such that the transistors are de-energized when the base input circuit is grounded, or even when the base is brought close to ground potential. In addition, when the transistors are energized, the collector-to-emitter impedance is so low that the voltage at the collector is reduced almost to the ground potential of the emitter. Therefore, when a first transistor is energized, a second transistor having its base connected to the collector of the first transistor is turned off. Similarly, when the first transistor is de-energized, the second transistor is energized. When two transistors have their emitters and collectors connected in series, the grounding of either of the two bases enforces the de-energization of both transistors. Other details involved in the fundamental D.C.T.L. circuits are disclosed in an article by R. H. Beter et al. which appeared at pages 139 through 145 of part 4 of the 1955 Institute of Radio Engineers Convention Record.

The circuit of Fig. 1 generates square waves in its main delay loop. When a negative enabling voltage is applied to the base terminal 12 of the transistor 14, the circuit including the transistor 16 oscillates between two states with a period equal to twice the delay introduced by the delay line 18. Assuming that a negative enabling voltage is maintained on the base electrode 12 of the transistor 14, the circuit operates in the following manner. As collector current starts flowing through the transistor 16, the voltage at point A rises from a negative value to ground. This positive-going transition or change of state is transmitted through the delay line 18 and eventually is applied to the base input lead 20 of transistor 16. As noted above, the application of ground potential to the base electrode of a transistor in a D.C.T.L. circuit turns the transistor off. The potential at point A then drops to the negative value provided by the voltage source connected to terminal 22. After the negative-going transition passes through the delay line 18, transistor 16 starts conducting again. This cycle is repeated and a square wave output signal is produced in the loop including delay line 18 as long as a negative enabling voltage is maintained on control electrode 12. A typical output wave cycle is shown in plot A in Fig. 2.

Coupled to taps along the delay line 18 are the inhibit circuits 24 and 26. When tap 36 in Fig. 1 is at a negative potential, the transistors 28 and 30 in the inhibit circuit 24 are conducting, and output B is at ground potential. It should also be noted that transistor 32, which has its base connected to the collector of transistor 28, is de-energized. Now, when a positive-going transition is applied to delay line 18, it reaches taps 34 and 36 in succession. When the potential of tap 34 is raised to ground potential, transistor 30 is de-energized, and the potential at output B assumes the negative value of the supply voltage. When tap 36 is raised to ground potential, however, transistor 28 is de-energized and transistor 32 is energized. This has the effect of raising the voltage at output B to ground potential once more. The brief negative pulse which results from this sequence of operations is shown at B in Fig. 2.

In the foregoing paragraph, it has been shown that when the normal input to an inhibit unit is connected to one tap on the delay line 18 and the inhibiting input terminal is connected to a later tap on the delay line, a brief pulse is produced during the cycle of oscillation of the circuit of Fig. 1 in which the transistor 16 is conducting. In the following paragraph, it will be shown that a similar brief pulse may be produced during the portion of the cycle of oscillation when transistor 16 is nonconducting by reversing the tap connections to the normal and the inhibiting input terminals of an inhibit unit.

Referring to the operation of the inhibit unit 26, the inhibiting input terminal 38 is connected to the first tap 34 on the delay line 18, and the normal input lead 40 is connected to the second tap 36 on the delay line 18. When taps 34 and 36 are both at a negative voltage level, transistor 42 is enabled and transistor 44 is energized. With transistor 44 being energized, the transistor 46 having its base connected to the collector of transistor 44 is de-energized. When transistor 46 is de-energized, output C has a negative value. As mentioned above, when a positive-going transition is applied to the delay line 18, the potentials at taps 34 and 36 are raised in succession. When the voltage at tap 34 rises to ground potential, transistor 42 is de-energized. Inasmuch as output C is already negative, this has no effect on its state. When tap 36 on the delay line 18 is raised to ground potential, transistor 44 is de-energized and its associated transistor 46 is enabled. Despite the negative potential on the base of transistor 46, no collector current can flow in transistor 46 in view of the de-energization of transistor 42.

After transistor 16 stops conducting, the resultant negative-going transition passes through taps 34 and 36 in succession. When tap 34 returns to a negative value, transistor 42 is energized and output C rises to ground potential. As the negative-going transition passes tap 36, however, the base of transistor 44 assumes a negative potential and transistor 44 is energized. This cuts transistor 46 off, and output C returns to a negative value. The resultant pulse produced at output C may be observed at C in Fig. 2.

In the description of the operation of the inhibit circuits 24 and 26, it has been shown that the connection of the inhibit and normal input terminals of the inhibiting units determines the portion of the cycle of operation in which an output pulse is produced. Similarly, the polarity of the output pulse may be determined by the selection of a series or parallel type inhibit unit. Thus, with an inhibit unit such as that shown in block 24 having parallel transistors 30 and 32, a negative-going pulse is produced, while with the series connected transistors 42 and 46 in inhibit unit 26, a positive-going output pulse is produced.

Figure 3:
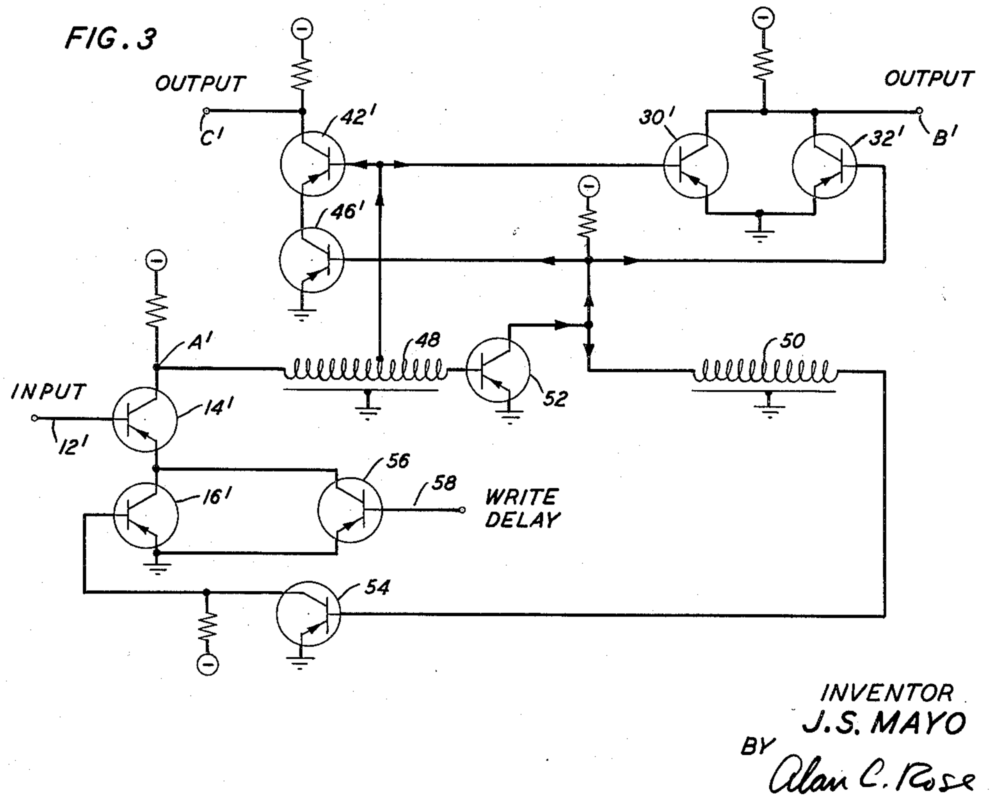
Fig. 3 is a circuit diagram of a slightly more elaborate control circuit illustrative of another specific embodiment of the invention.

The control circuit of Fig. 3 is generally patterned after that of Fig. 1, but includes a few changes and additions. In general, the transistors in the circuit of Fig. 3 which correspond to those of Fig. 1 are identified by primed reference numerals corresponding to the unprimed reference numerals employed in Fig. 1. Thus, for example, the principal transistor 16 of Fig. 1 is identified as transistor 16' in Fig. 3. Similarly, the oscillation control transistor 14 of Fig. 1 finds its counterpart in transistor 14' in Fig. 3. The series connected transistors 42 and 46 of Fig. 1 are replaced by the transistors 42' and 46' in Fig. 3 which perform the same function. It should be noted that while the transistors 30' and 32' in Fig. 2 perform the same functions as transistors 30 and 32 in Fig. 1, their relative positions are interchanged.

Now, referring to the differences between the circuits of Figs. 1 and 3, in Fig. 3 the delay loop includes two delay line sections 48 and 50. In addition, the transistor 52 has its base connected to the output of delay line 48 and its collector connected to the input of delay line 50. The transistor 52 is connected to the point corresponding to tap 36 on the delay line 18 in Fig. 1. The transistor 52 takes the place of both transistors 28 and 44. In view of the fact that both of the transistors 28 and 44 are energized at the same instant in Fig. 1, the substitution of the transistor 52 does not change the operation of the two inhibit circuits. Accordingly, outputs B' and C' occur as indicated in Fig. 2 at B and C.

As explained above in the general consideration of D.C.T.L. circuits, however, each grounded emitter transistor produces an inversion in circuit state. Thus, when a positive-going pulse raises the base of transistor 52 to ground potential, the transistor 52 is de-energized, and its collector drops to a negative voltage level. To re-establish the proper polarity of signal at the base electrode of transistor 16', another transistor 54 must be connected in the series delay loop. The second transistor amplifier 54 produces a second inversion of polarity and the transistor circuit including the two transistors 52 and 54 oscillates just as though these two transistor amplifiers were removed from the circuit. To define terms which will be employed in the present specification and claims, the portion of the delay loop between transistors 52 and 54 is designated an "inversion" section of the delay loop, in contrast to the portions of the delay loop before transistor 52 and after transistor 54, which will be designated "positive" portions or sections of the loop.

The circuit of Fig. 3 would normally oscillate between two states in which the transistor 16' is first conducting and then nonconducting for equal time intervals. In the absence of transistor 56, this oscillation would normally continue as long as a negative enabling potential is maintained on input lead 12'. However, in Fig. 3 the additional transistor 56 is provided to permit delaying the second portion of the cycle in which transistor 16' would be de-energized and point A' would drop to a negative potential. Normally, after transistor 16' has been conducting for a time interval equal to the delay of the delay lines 48 and 50, the base of transistor 16' is grounded, and transistor 16' turns off. When this occurs, Point A' drops to a negative voltage level. If a negative input pulse is applied to the base electrode of transistor 56 on lead 58, however, current will still flow through transistors 14' and 56, maintaining point A' at ground potential.

The lead 58 is designated the "write delay" lead in view of the application of the control circuit of the type shown in Fig. 3 to magnetic core matrix control. The portion of the cycle in which transistor 16' is conducting is designated the "read" portion of the cycle, whereas the portion of the cycle in which transistor 16' is nonconducting is the "write" portion of the cycle. Thus, by applying a negative pulse to lead 58, the "write" portion of the cycle may be delayed indefinitely. When it is desired to initiate the "write" portion of the cycle, lead 58 is raised to ground potential. When this occurs, both transistors 16' and 56 are de-energized, and point A' drops to a negative voltage level. This initiates the second portion of the cycle in which transistor 16′ is deenergized. After a delay equal to the length of the delay lines 48 and 50, transistor 16′ becomes energized once more, and oscillation continues until the control signals at leads 12′ or 58 are changed.

Figure 4:
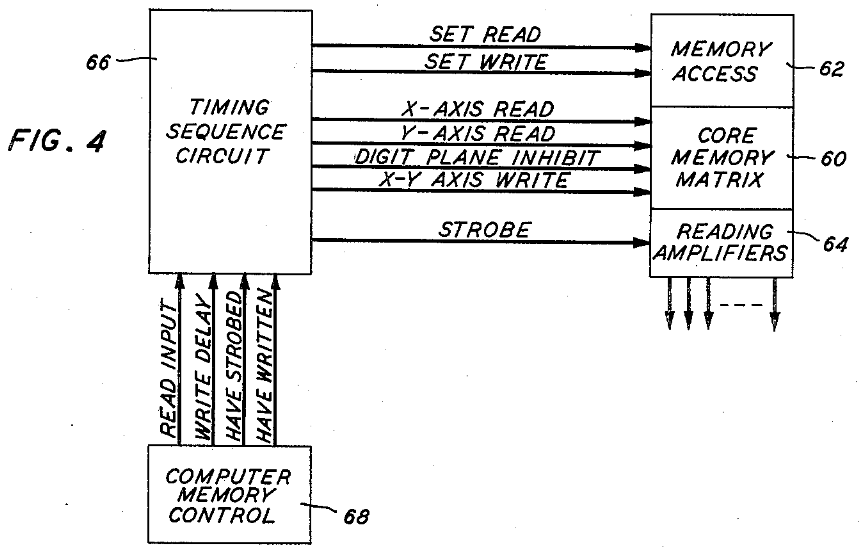
Fig. 4 is a block diagram of a magnetic core memory matrix and its associated control circuits.

Fig. 4 is a block diagram which is included to place the present control circuits in their proper context in an illustrative computer application. In Fig. 4, the core memory matrix 60 has a memory access circuit 62 and output "read" amplifiers 64 associated with it. A timing sequence circuit 66 must be provided to synchronize and coordinate the required operations of the core memory matrix and its associated circuitry. The principal signals which are required are indicated by legends on the leads interconnecting the timing sequence circuit 66 and the core memory matrix 60, the memory access unit 62, and the read amplifiers 64. The operation of the timing sequence circuit is controlled by signals from the computer memory control unit 68. Signals are in turn applied from the timing sequence circuit 66 to the computer memory control 68 to indicate the progress of the core memory control cycle. For the background indicating in general the need for the control signals such as those indicated in Fig. 4, reference may be made to an article entitled "Ferrite-Core Memory" which appeared at pages 158 through 161 of the February 1956 issue of Electronics. In addition, the nature of the transistor amplifiers and other associated circuitry which have been employed in connection with one magnetic core memory circuit arrangement is disclosed in an article entitled "Transistorized Magnetic Core Memory" which appeared on pages 210 through 218 of the September 1956 issue of Electronics.

Figure 5:
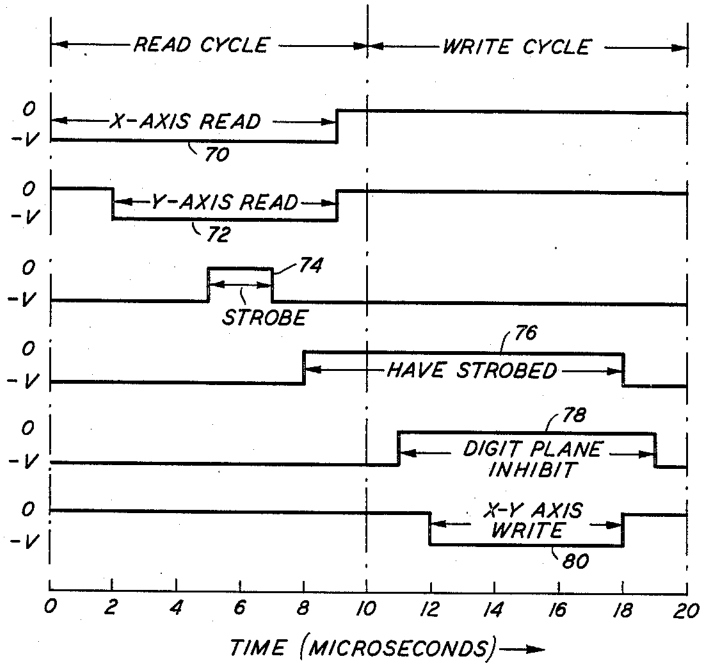
Fig. 5 is a series of plots showing the voltages required at points in the circuit of Fig. 4.

Referring to Fig. 5, the timing of a number of the control signals indicated in Fig. 4 is shown in somewhat greater detail. Initially, considering a memory control cycle twenty microseconds in length, the first ten microsecond period constitutes the read portion of the cycle, and the second ten microsecond period constitutes the write portion of the cycle. In general, however, the read and write portions of the cycle need not have the same length. In the plots of Fig. 5, the indicated control signals may be either positive or negative. In Fig. 5, however, they are shown as they will actually be developed by the control circuit of Fig. 6. Considering the individual plots in detail, it may be noted that the *x*-axis read signal 70 is developed first. Then, after the initial surge associated with the application of the *x*-axis read signal has died down, the *y*-axis read signal 72 is applied to the core matrix. A gating or "strobe" signal 74 is then applied to the read amplifiers 64 at the output of the core memory matrix 60. Following the termination of the strobe signal 74, a signal 76 indicating that the strobe operation had been completed is transmitted to the computer memory control circuit 68. During the write cycle, it is necessary to inhibit the change of magnetization state of certain cores. This is accomplished by the digit plane inhibit control signal 78. The *x*—*y* write signal 80 is then applied to the core matrix. It may be noted that the *x*—*y* write control signal is bracketed by the digit plane inhibit signal.

Figure 6:
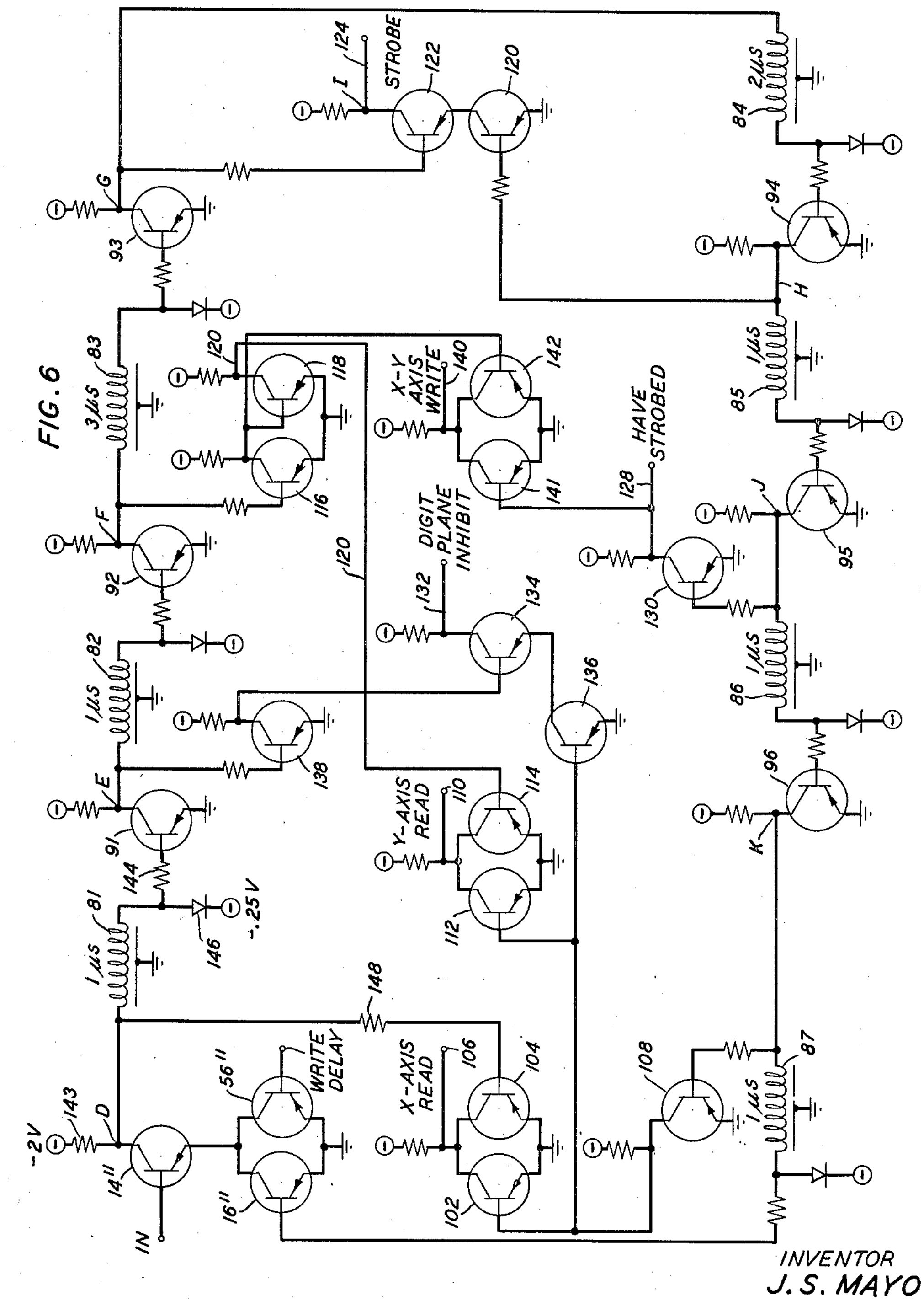
Fig. 6 is a control circuit illustrative of another specific embodiment of this invention for deriving properly timed pulses for use with a core memory matrix.

In Fig. 6, a control circuit is presented which will develop the signals shown in the plots of Fig. 5. The circuit of Fig. 6 is patterned generally after that of Fig. 3. To indicate the correspondence between the circuits of Fig. 6 and Fig. 3, the three transistors 14′, 16′, and 56 of Fig. 3 have their corresponding transistors 14″, 16″, and 56″ identified by doubly primed reference numbers in Fig. 6.

In Fig. 6, the delay loop interconnecting the collector of transistor 14″ and the base of transistor 16″ includes seven delay line sections 81 through 87. In addition, the circuit of Fig. 6 has six transistors 91 through 96 having their base-to-collector circuits connected between the delay line sections 81 through 87, respectively. As indicated in the discussion of Fig. 3, the insertion of an even number of transistor amplifiers in the delay loops does not affect the operation of the circuit, as seen from transistors 14″ and 16″. Accordingly, the transistor 16″ oscillates with a period which is twice the total delay of the delay lines 81 through 87 in much the same manner as the circuits of Figs. 1 and 3, when appropriate control signals are applied to transistors 14″ and 56″. In view of the presence of the six transistors 91 through 96, however, there are six changes of phase in the course of the transmission of signals around the delay loop.

Figure 7:
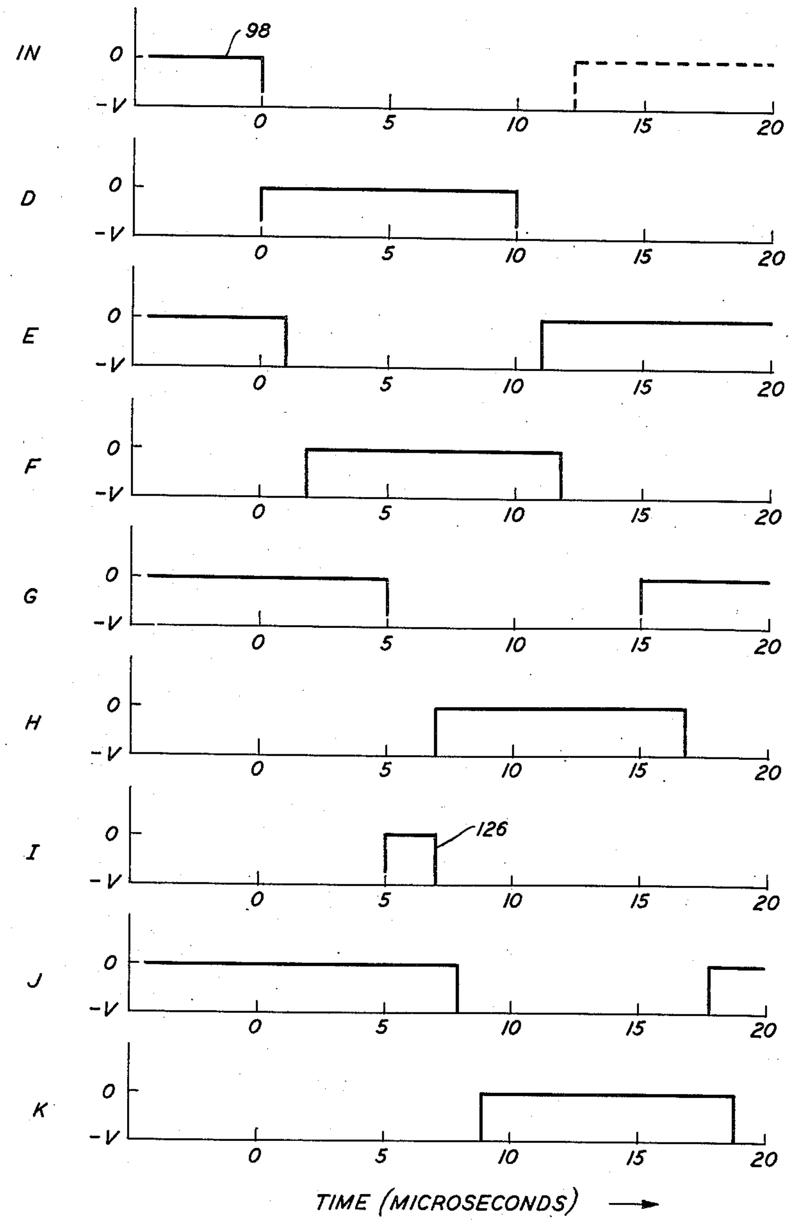
Fig. 7 shows a series of plots of voltages present at various points in the circuit of Fig. 6.

In Fig. 7, a series of plots are shown indicating the voltages at various points in the circuit of Fig. 6 during the course of a read-write cycle. The first plot 98 of Fig. 7 represents the input control signal to the base of transistor 14″. The plots designated by the letters D through H, J, and K represent voltages at various points around the delay loop. In addition, the output strobe signal is represented by the plot I in Fig. 7.

Before continuing the analysis of Fig. 6, it is useful to refer again to Fig. 3. In Fig. 3, it was noted that a parallel transistor circuit such as that made up of transistors 30′ and 32′ produces a negative-going pulse during the first half cycle of operation when it has the base input terminal of one transistor connected to a positive point in the delay loop, and the input terminal of the other transistor connected to a point in the delay loop following the inverting transistor 52. Similarly, the series connected pair of transistors 42′ and 46′ produces a positive pulse during the second half cycle of operation when the two inputs are connected to positive and inversion points in the delay loop. It may also be readily demonstrated that if the connections to the delay loop are to an inversion point and then a positive point, respectively, along the delay line, the output pulses will appear in the opposite half cycle from those described above. With the variables indicated above, therefore, either positive or negative-going pulses of any desired timing within the full cycle of oscillation of transistor 16′ may be produced.

In Fig. 6, it has been noted that there are six transistors 91 through 96 included in the series delay loop associated with transistors 14″ and 16″. Each of these transistors inverts the signal applied to it. Accordingly, alternate portions of the delay loop may be designated positive and inversion sections of the delay loop. When circuits of the type described in the preceding paragraph are to be connected to positive and inversion sections of the delay loop, any section having the proper polarity may be employed. In addition, if it is desired to have a signal of a predetermined polarity at a time when that polarity is not directly available, an additional transistor may be employed to invert the signal to the proper polarity.

Referring again to Fig. 5, the first signal which is required is an *x*-axis read signal. This is obtained by the parallel circuit including transistors 102 and 104 in Fig. 6. The *x*-axis read signal is obtained at lead 106 connected to the collectors of both of transistors 102 and 104. The base of transistor 104 is connected to point D. Point D is located in the positive section of the delay loop between transistors 14″ and 91 before delay line 81. In Fig. 7, it may be noted that the plot D shows a positive-going pulse starting at zero microseconds and extending for a ten microsecond period. In accordance with our criteria established above and as indicated in plot 70 of Fig. 5, a negative output pulse appears at lead 106 starting at zero microseconds. It is desired to terminate this pulse nine microseconds later. It would therefore be desirable to connect the base input of transistor 102 to an inversion section of the delay line at a point which is spaced by delay lines totalling nine microseconds from point D. However, the point K at the output of transistor 96 is in a positive section of the delay loop. Accordingly, an additional transistor 108 is inserted between point K and the base of transistor 102 to obtain the proper potential at the base of transistor 102. With this circuit arrangement, the x-axis read signal starts at zero microseconds and terminates nine microseconds later.

It is desired to initiate the y-axis read signal on lead 110 two microseconds after the start of the x-axis read signal. The parallel transistor circuit which controls the y-axis read signal includes transistors 112 and 114. With the delay lines 81 and 82 each including one microsecond of delay, it would be desirable to connect the base of transistor 114 to point F at the collector of transistor 92. However, other transistors must be driven from this point, in addition to the application of signals to delay line 83 for propagation around the delay loop. Accordingly, a branching circuit including transistors 116 and 118 is provided to reduce the loading at point F. It may be noted that point F is located in a positive section of a delay loop and thus would have the proper signal polarity for direct coupling to the base of transistor 114. Accordingly, when a branch amplification circuit is required, two successive stages of inversion are required to return the signal on lead 120 at the output of transistor 118 to the proper polarity. With transistors 116 and 118 having their base-to-collector circuits connected in series between point F and the base of transistor 114, the y-axis read signal is initiated at the desired time, two microseconds after the start of the x-axis read signal. The y-axis read signal is terminated by a pulse applied to the base of transistor 112 simultaneously with the application of a pulse to transistor 102, which terminates the x-axis read signal.

The positive-going strobe signal is shown at 74 in Fig. 5 and is produced by the series connected transistors 120 and 122 in Fig. 6. Before the energization of transistor 14″ by the application of a negative enabling signal to its base, the successive points D, E, F, G, and H in successive positive and inversion sections of the delay loop are alternately at negative and at ground potentials. As indicated in Fig. 7, point G is at ground potential until five microseconds after the operation of the circuit of Fig. 6 is initiated. Similarly, point H is at a negative potential until seven microseconds have elapsed. The strobe output lead 124 is normally at a negative potential, and rises to ground potential only when both transistors 120 and 122 are energized. Initially, with point G at ground potential, transistor 122 is de-energized. With point H at a negative potential, transistor 120 is enabled, but the de-energization of transistor 122 effectively open-circuits the collector circuit of transistor 120. During the two microsecond interval after point G drops to a negative potential and before point H in the following stage goes positive, both transistor 120 and transistor 122 are energized. The two microsecond positive pulse produced while the change of state is traversing delay line 84 is indicated at 126 associated with plot I in Fig. 7, as well as at 74 in Fig. 5.

Referring to Figs. 5 and 6, a positive signal 76 designated the "have strobed" signal is initiated on terminal 128 one microsecond after the termination of the strobe signal. The "have strobed" signal at lead 128 is controlled by transistor 130 coupled to the collector of transistor 95. Because the length of the "have strobed" signal is not critical, a single transistor 130 is sufficient to provide a properly timed and amplified signal having the same ten microsecond duration as the pulses which circulate around the complete delay loop of Fig. 6.

The digit plane inhibit signal 78 in Fig. 5 must bracket the x—y write signal 80 of Fig. 5, and the digit plane inhibit signal therefore extends from eleven to nineteen microseconds, referring to the time scale employed in Figs. 5 and 7. The positive digit plane inhibit signal on lead 132 of Fig. 6 is developed by the two series connected transistors 134 and 136. In order to produce a signal during the write portion of the memory cycle, the two series connected transistors must be energized successively by a positive and an inverted signal. Because the point E is in an inversion section of the delay loop, an additional transistor 138 must be provided to produce a signal of the proper polarity at the base of transistor 134. The output from transistor 138 energizes transistor 134 and produces a positive-going transition on lead 132 eleven microseconds after the enabling of the circuit of Fig. 6. To de-energize the digit plane inhibit lead 132 at nineteen microseconds, the base electrode of transistor 136 is energized in common with the bases of transistors 102 and 112. The output from transistor 108 is clearly of the proper inverted polarity in view of the fact that the point K is coupled directly to the main controlling transistor 16″.

The final output signal indicated in Fig. 5 is the x—y axis write signal, which is produced on lead 140 in the circuit of Fig. 6. This signal is produced by the parallel combination of transistors 141 and 142. The proper inverted signal is first applied to transistor 142 from the collector of transistor 116. Subsequently, an appropriate positive signal is applied to transistor 141 from the collector of transistor 130.

The foregoing remarks complete the over-all discussion of the operation of the circuit of Fig. 6. However, it is considered desirable to mention certain circuit details which have not been considered up to the present time. Specifically, in the present circuits it is desirable to use surface barrier or alloy junction transistors either of the germanium or silicon type which have high response speeds and which are essentially de-energized when their base electrodes are brought close to ground potential. The Philco SB–100 transistor is well suited to these purposes. Either NPN or PNP transistors may be employed with an appropriately poled supply voltage source. Concerning the voltage levels and the magnitudes of the collector resistances which are employed, values of minus two volts and 510 ohms have proved satisfactory. However, the circuit is operative over a wide range of supply voltages; for example, D.C.T.L. circuits of this type have been operated with voltages from one-half to twelve volts. This wide variation is possible because the critical ratio of base current to collector current remains substantially the same with changes in supply current.

In one operative circuit, the characteristic impedance of the delay lines was 1,200 ohms. Considering the section of the circuit of Fig. 6 between transistors 14″ and 91, therefore, the two transistors are SB–100 transistors, the resistor 143 has a value of 510 ohms, and the delay line 81 has a characteristic impedance of 1,200 ohms. It is desirable that the base input impedance of the transistor 91 and resistor 144 match that of the delay line 81. Accordingly, with the impedance of an SB–100 transistor being equal to about 200 ohms, resistor 144 must have a resistance of about 1,000 ohms. When the transistor 91 is de-energized, the diode 146 should match the impedance of the delay line 81. To accomplish this, the diode 146 should be biased slightly in the negative sense. Employing a germanium junction type diode, this negative voltage should be approximately 0.25 volt. When transistors are driven from a point such as D before the delay line 81, the connecting resistor, such as 148 in the case of transistor 104, should have a value of about 2,000 ohms. It is to be understood, of course, that the foregoing specific circuital values are merely illustrative, and that the present circuits may readily be instrumented with other components.

Concerning other more general design considerations which have been employed in developing the circuit of Fig. 6, it may be noted that the series and parallel output circuits are generally driven directly from the collector of one of the transistors 91 through 96 in the delay loop. This method is desirable in order to avoid the losses introduced by the sections of delay line. If somewhat higher signal levels were employed, it would be possible to drive the transistor output circuits from the output of the delay lines. Under these circumstances, inversion stages could be avoided in some cases. Use of higher gain transistors would allow economies in the number of transistors employed by permitting the connection of two or more transistors to the collector of a transistor in the delay loop. Concerning a slightly different design matter, it is possible to speed up transistor switching action by the use of small by-pass condensers in parallel with resistors such as those indicated at 144 and 148. Such condensers are particularly helpful in reducing the time required for transistors to come out of saturation when they are de-energized.

In the foregoing discussion, it has been assumed that the memory control cycles include read and write portions of equal duration. When it is desired to use cycles of different lengths, branch circuits may be employed to by-pass a section of delay line for either the read or the write portion of the control cycle. Alternatively, if it is not disadvantageous to forego delaying the write portion of the cycle with respect to the read portion of the timing cycle, control pulses which start and stop at any time during the complete timing cycle may also be readily developed.

It is to be understood that the above-described arrangements are illustrative of the application of the principles of the invention. Numerous other arrangements may be devised by those skilled in the art without departing from the spirit and scope of the invention.

What is claimed is:

1. A direct coupled transistor timing circuit comprising a control transistor having its emitter grounded, a circuit including a delay line intercoupling the collector and the base of said transistor, transistor means for energizing said control transistor, an output circuit, and additional transistor means connected to spaced points along said delay line, said additional transistor means being responsive to signals applied to said delay line for energizing said output circuit.

2. A transistor timing control circuit comprising a transistor, a delay loop interconnecting the collector and the base of said transistor, and a plurality of transistor inhibit circuits each connected to spaced points along said delay loop.

3. A transistor timing circuit comprising a control transistor, a delay loop circuit interconnecting the collector and the base of said control transistor, an even number of additional transistors having their base-to-collector circuits connected in series in said delay loop circuit to define positive and inversion sections of said delay loop, and a circuit including two transistors connected in parallel having one input terminal connected to a positive section of said delay loop and another input terminal connected to an inversion section of said delay loop.

4. A transistor timing circuit comprising a control transistor, a delay loop circuit interconnecting the collector and the base of said control transistor, an even number of additional transistors having their base-to-collector circuits connected in series in said delay loop circuit to define positive and inversion sections of said delay loop, and a circuit including two transistors having their emitter-to-collector circuits connected in series and having one base input terminal connected to a positive section of said delay loop and another base input terminal connected to an inversion section of said delay loop.

5. A transistor timing circuit comprising a control transistor, a delay loop circuit interconnecting the collector and the base of said control transistor, an even number of additional transistors having their base-to-collector circuits connected in series in said delay loop circuit to define positive and inversion sections of said delay loop, a circuit including two transistors connected in parallel and having one input terminal connected to a positive section of said delay loop and another input terminal connected to an inversion section of said delay loop, and a circuit including two transistors connected in series and having one input terminal connected to a positive section of said delay loop and another input terminal connected to an inversion section of said delay loop.

6. In combination, a memory matrix, a transistor having input and output leads, a delay loop interconnecting said output and input leads, control circuit means for enabling the oscillation of said transistor between successive energized and de-energized states, transistor circuit means connected to spaced points in said delay loop for applying read signals to said memory matrix during one state of said transistor, and additional transistor circuit means connected to spaced points in said delay loop for applying write signals to said memory matrix during the other state of said transistor.

7. In combination, a magnetic core memory matrix, a transistor having a delay loop interconnecting its collector and base electrodes, control circuit means for enabling the oscillation of said transistor between successive energized and de-energized states, transistor circuit means connected to spaced points in said delay loop for applying read signals to said core memory matrix during one state of said transistor, and additional transistor circuit means connected to spaced points in said delay loop for applying write signals to said core memory matrix during the other state of said transistor.

8. A transistor timing circuit comprising a control transistor, a delay loop circuit interconnecting the collector and the base of said control transistor, an even number of additional transistors having their base-to-collector circuits connected in series in said delay loop circuit to define positive and inversion sections of said delay loop, and an inhibit circuit having one input terminal connected to a positive section of said delay loop and another input terminal connected to an inversion section of said delay loop.

9. In combination, a first transistor, a delay loop connected between the collector and the base of said first transistor, and means including a second transistor having its emitter-to-collector circuit connected in parallel with the emitter-to-collector circuit of said first transistor for delaying the cycle of oscillation of said first transistor.

10. In combination, a first transistor, a delay loop connected between the collector and the base of said first transistor, a second transistor having its emitter-to-collector circuit connected in series with said delay loop, and a third transistor having its emitter-to-collector circuit connected in parallel with the emitter-to-collector circuit of said first transistor.

11. In combination, a load circuit, a transistor having input and output leads, a delay loop interconnecting said output and input leads, control circuit means for enabling the oscillation of said transistor between successive energized and de-energized states, transistor circuit means connected to spaced points in said delay loop for applying control signals to said load circuit during one state of said transistor, and additional transistor circuit means connected to spaced points in said delay loop for applying additional control signals to said load circuit during the other state of said transistor.

12. In combination, a load circuit, a transistor having a delay loop interconnecting its collector and base electrodes, control circuit means for enabling the oscillation of said transistor between successive energized and de-energized states, transistor circuit means connected to spaced points in said delay loop for applying signals to said load circuit during one state of said transistor, and additional transistor circuit means connected to spaced points in said delay loop for applying additional signals to said load circuit during the other state of said transistor.

References Cited in the file of this patent

UNITED STATES PATENTS

| | | |
|---|---|---|
| 2,489,302 | Levy | Nov. 29, 1949 |
| 2,510,167 | Boothroyd | June 6, 1950 |
| 2,556,296 | Rack | June 12, 1951 |
| 2,691,154 | Rajchman | Oct. 5, 1954 |
| 2,739,300 | Haynes | Mar. 20, 1956 |
| 2,755,384 | Pierson et al. | July 17, 1956 |
| 2,759,111 | Wideroe | Aug. 14, 1956 |
| 2,760,087 | Felker | Aug. 21, 1956 |
| 2,764,687 | Buchanan et al. | Sept. 25, 1956 |
| 2,787,717 | Kasmir | Apr. 2, 1957 |
| 2,798,169 | Eckert | July 2, 1957 |
| 2,810,080 | Trousdale | Oct. 15, 1957 |
| 2,825,889 | Henle | Mar. 4, 1958 |
| 2,830,199 | Mofenson | Apr. 8, 1958 |
| 2,850,630 | Prugh | Sept. 2, 1958 |

FOREIGN PATENTS

| | | |
|---|---|---|
| 166,009 | Australia | Nov. 15, 1955 |

OTHER REFERENCES

"Directly Coupled Transistor Circuits" (Beter et al.), Electronics, June 1955.

"Electronics in Telephone Switching Systems" (Joel), Bell Telephone System, Monograph 2691, pp. 1–27, June 25–29, 1956.

"What's Inside Transac" (Cavalieri, Jr.), Electronic Design, vol. 4, pp. 22–25, July 1, 1956.